United States Patent [19]
Dixon et al.

[11] 4,447,905
[45] May 8, 1984

[54] CURRENT CONFINEMENT IN SEMICONDUCTOR LIGHT EMITTING DEVICES

[75] Inventors: Richard W. Dixon, Bernardsville; Louis A. Koszi, Scotch Plains; Richard C. Miller, Summit; Bertram Schwartz, Westfield, all of N.J.

[73] Assignee: Bell Telephone Laboratories, Incorporated, Murray Hill, N.J.

[21] Appl. No.: 247,523

[22] Filed: Mar. 25, 1981

[51] Int. Cl.³ ............................................. H01S 3/19
[52] U.S. Cl. ........................................ 372/46; 357/17
[58] Field of Search ............................. 372/46; 357/17

[56] References Cited

U.S. PATENT DOCUMENTS 3,363,195  1/1968  Furnanage ........................... 372/46
3,824,133  7/1974  D'Asaro .............................. 372/46

FOREIGN PATENT DOCUMENTS 55-55593  4/1980  Japan ................................... 372/46

OTHER PUBLICATIONS

H. C. Casey, Jr., "Heterostructure Lasers", Academic Press, Inc., Part B, pp. 207–210, (1978).
W. B. Joyce, "Current-Crowded Carrier Confinement in Double-Heterostructure Lasers", *J. Appl. Phys.*, vol. 51(5), May 1980, pp. 2394–2401.
R. W. Dixon et al., "(Al, Ga)As Double-Heterostructure Lasers . . . ", *BSTJ*, vol. 59, No. 6, Jul.-Aug. 1980, pp. 975–985.

*Primary Examiner*—James W. Davie
*Attorney, Agent, or Firm*—Michael J. Urbano

[57] ABSTRACT

Semiconductor light emitting devices, lasers and LEDs, are described in which the current flow channel is narrower near the top surface of the device and wider at its bottom near the active region. Also, described are several attenuation masks for fabricating the channels of these devices by particle bombardment.

13 Claims, 6 Drawing Figures

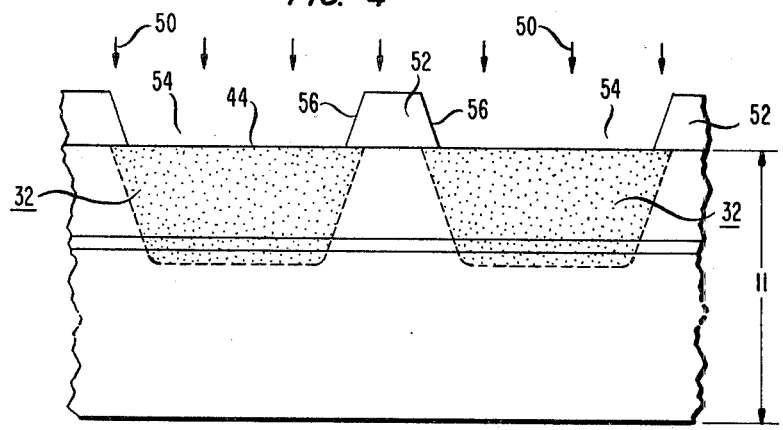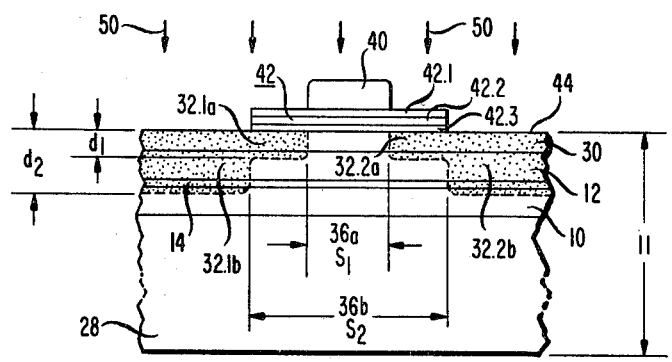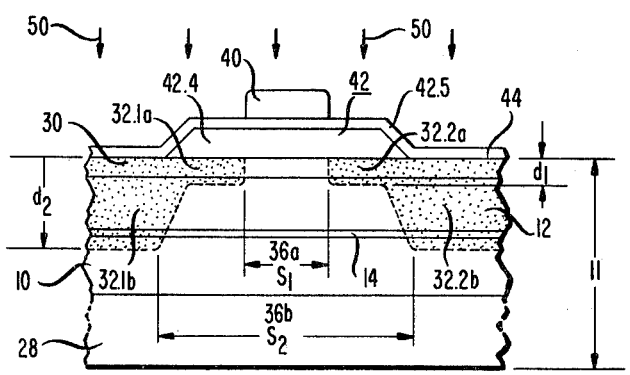

CURRENT CONFINEMENT IN SEMICONDUCTOR LIGHT EMITTING DEVICES

CROSS REFERENCE TO RELATED APPLICATIONS

This application was concurrently filed with application Ser. No. 247,627, U.S. Pat. No. 4,408,331, by R. L. Hartman et al entitled "V-Groove Semiconductor Light Emitting Devices."

BACKGROUND OF THE INVENTION

This invention relates to light emitting semiconductor devices, such as lasers and LEDs, and more particularly to the confinement of current flow in these devices.

Nearly two decades ago light emitting semiconductor devices, especially those having a planar p-n junction in a monocrystalline semiconductor body, utilized broad area electrical contacts on opposite major surfaces of the body to apply forward bias voltage and pumping current to the junction. In an LED the resulting radiative recombination of holes and electrons in the active region in the vicinity of the junction generated spontaneous radiation. Primarily, one fundamental modification converted the LED to a laser: a cavity resonator was formed on the semiconductor body by a pair of parallel cleaved crystal facets orthogonal to the junction. When the pumping current exceeded the lasing threshold, the spontaneous radiation, which in the LED was emitted from the active region essentially isotropically, was converted to stimulated radiation, which in the laser was emitted as a collimated beam parallel to the junction and along the resonator axis. Of course, other design considerations played a role in making the advance from LED to laser, but these matters are not discussed here inasmuch as our purpose at this point is merely to state the now well-known kinship between p-n junction lasers and LEDs.

The broad area contacts (e.g., 100 μm wide) on these devices caused the pumping current density at the p-n junction to be relatively low which, therefore, meant that relatively high currents (e.g., hundreds of mA in lasers) were required to achieve desirable radiation power levels. High currents in turn heated the semiconductor body and necessitated coupling the device to a suitable heatsink and/or operation of the device at cryogenic temperatures. The basic solution to this problem was then, and is today, to reduce the area of the p-n junction which has to be pumped so that for a given current density the amount of pumping current required is proportionately lower. One implementation of this solution is to constrain the pumping current to flow in a relatively narrow channel (e.g., 12 μm wide) from a major surface of the semiconductor body through the active region.

One of the earliest structures for constraining current to flow in such a channel was the stripe geometry contact first proposed for semiconductor lasers by R. A. Furnanage and D. K. Wilson (U.S. Pat. No. 3,363,195 issued on Jan. 9, 1968). The stripe geometry reduces the threshold current for lasing (compared to lasers with broad area contacts) and limits the spatial width of the output beam. Since that early proposal, numerous laser configurations have been devised to implement the stripe geometry concept: (1) the oxide stripe laser; (2) the proton bombarded laser; (3) the mesa stripe laser; (4) the reverse-biased p-n junction isolation laser; (5) rib-waveguide lasers; and (6) buried heterostructures of various types.

The most commonly used configuration for the past eleven years, however, has been the proton bombarded, GaAs-AlGaAs double heterostructure (DH) laser described, for example, by H. C. Casey, Jr. and M. B. Panish in *Heterostructure Lasers*, Part B, pp. 207–210, Academic Press, Inc., N.Y., N.Y. (1978). Despite its various shortcomings, lasers of this type have regularly exhibited projected lifetimes in excess of 100,000 hours and a number have exceeded 1,000,000 hours (based on accelerated aging tests). Long lifetimes have also been projected in DH LEDs employing different contact geometries (e.g., dot-shapes or annular rings) but similar proton bombardment to delineate the current channel.

Several of the shortcomings of proton bombarded DH lasers are discussed by R. W. Dixon et al in *The Bell System Technical Journal*, Vol. 59, No. 6, pp. 975–985 (1980). They explored experimentally the optical non-linearity (presence of "kinks" in the light-current (L-I) characteristics) and the threshold current distribution of AlGaAs, proton-bombardment-delineated, stripe geometry DH lasers as a function of stripe width (5, 8, and 12 μm) in cases in which the protons did and did not penetrate the active layer. They demonstrated that shallow proton bombardment with adequately narrow stripes (e.g., 5 μm) can result in satisfactory optical linearity (kinks are driven to non-obtrusive, high current levels) without the threshold penalty that has been associated with narrow-stripe lasers in which the protons penetrate the active layer. On the other hand, lasers with such narrow stripes have exhibited a statistically meaningful, although not demonstrably fundamental, decrease in lifetime. In addition, failure of the protons to penetrate the active layer increases device capacitance and hence reduces speed of response and, moreover, increases lateral current spreading and hence increases spontaneous emission. In digital systems, the latter implies a higher modulation current to achieve a predetermined extinction ratio or a lower extinction ratio for a predetermined modulation current.

SUMMARY OF THE INVENTION

We have achieved satisfactorily high optical linearity, low capacitance, and low spontaneous emission levels in stripe geometry, proton bombardment-delineated, GaAs-AlGaAs DH lasers by means of a current constraining structure in which the current channel is narrower at the top near the p-side contact and wider at the bottom near the active layer. The structure is applicable to other materials systems, to LEDs as well a lasers, and to a variety of configurations other than the DH.

Accordingly, in an illustrative embodiment of a light emitting semiconductor device of our invention, a semiconductor body comprises an active region within the body, and constraining means through which current flows from a surface of the body to the active region, thereby causing radiative recombination of holes and electrons in the active region. The constraining means is located within the semiconductor body and forms a current flow channel which is narrower at its top near the surface and wider at its bottom near the active region. In one embodiment the constraining means forms, in cross-section, a trapezoidal-shaped channel. In another embodiment the constraining means forms a coupled pair of axial channels of different widths, the narrower channel being near the surface and the wider channel being near the active region.

Another aspect of our invention concerns a particle bombardment method of making such a device with a trapezoidal channel. The process involves first epitaxially growing a dispensable semiconductor layer on the major surface of the body and then exposing the layer to a preferential etchant which opens inverted trapezoidal stripes in the layer. The remaining portions of the layer form a trapezoidal attenuation mask (in cross-section). When the masked surface is subjected to particle (e.g., proton, oxygen) bombardment, high resistivity zones are created in the portions of the body between the masks and under the oblique sides of the trapezoids. These zones bound the current channel and give it the desired trapezoidal shape: narrow at the top near the surface and wider at the bottom near the active region. Before metallization of the body to form electrical contacts, the mask is removed. To this end the mask is preferably made of a material which is different from the portion of the body adjacent the surface so that a stop-etch procedure can be employed in its removal.

BRIEF DESCRIPTION OF THE DRAWINGS

Our invention, together with its various features and advantages, can be readily understood from the following more detailed description taken in conjunction with the accompanying drawings. In the interests of clarity, the figures have not been drawn to scale.

FIG. 4 is an end view of a mask structure for fabricating a light emitting device having a trapezoidal current channel in accordance with another aspect of our invention; and FIGS. 5 and 6 depict end views of alternative masks for fabricating devices according to our invention by means of proton bombardment.

DETAILED DESCRIPTION

General Considerations

Figure 1:
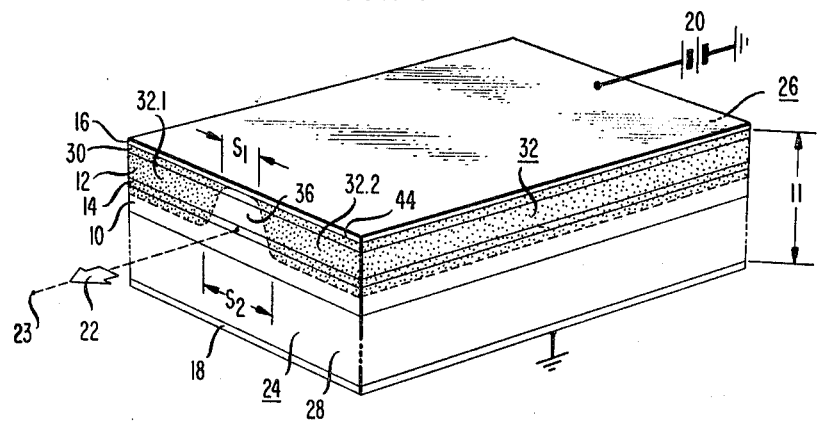
FIG. 1 is an isometric view of a light emitting semiconductor device having trapezoidal-shaped current channel in accordance with one embodiment of our invention.

With reference now to FIG. 1, there is shown a semiconductor light emitting device (laser or LED) comprising a semiconductor body 11 which includes an intermediate region 14. Region 14, which may have one or more layers, includes an active region which emits radiation 22 when pumping current is applied thereto. Electrode means, illustratively contacts 16 and 18 on body 11, is provided along with a voltage source 20 to supply the pumping current. In addition, body 11 includes constraining means 32 which causes the pumping current to flow in a relatively narrow channel 36 from the top contact 16 through the active region after which the current may spread out to bottom contact 18.

Figure 2:
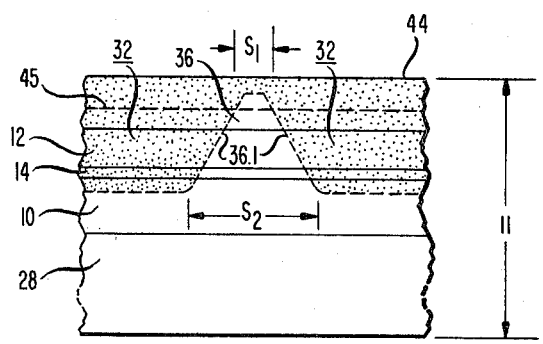
FIG. 2 is an end view of a semiconductor light emitting device having a trapezoidal-shaped current channel in accordance with another embodiment of our invention.
Figure 3:
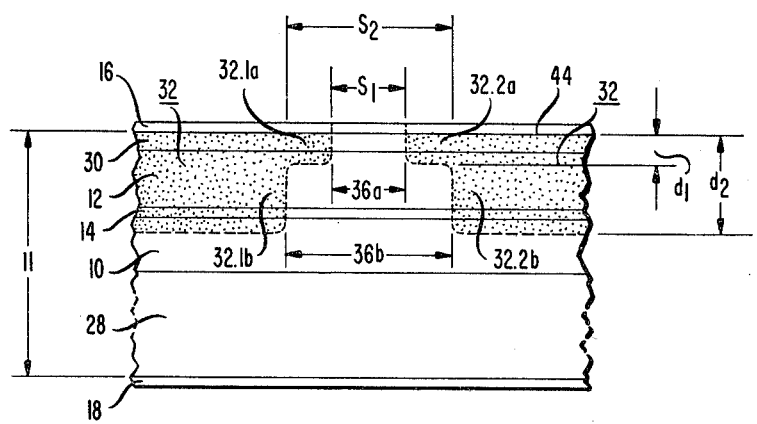
FIG. 3 is an end view of a semiconductor Hi-Lo light emitting device having a pair of stacked channels in accordance with yet another embodiment of our invention.

Before discussing our invention in detail, it will be helpful to discuss first the general attributes of a preferred configuration of a semiconductor light emitting device known as a double heterostructure (DH). As shown in FIGS. 1, 2, and 3, a DH comprises first and second relatively wide bandgap, opposite conductivity type, semiconductor cladding layers 10 and 12, respectively, and, essentially latticed matched thereto, intermediate region 14 which is between and contiguous with the cladding layers. The intermediate region 14 includes a narrower bandgap active layer, here shown to be coextensive with the region 14, capable of emitting radiation when the cladding layers are forward biased. From the standpoint of quantum efficiency, it is well known that the active layer is preferably a direct bandgap semiconductor. Layers 10, 12, and 14 can be made of materials selected from a number of systems; for example, GaAs-AlGaAs or GaAsSb-AlGaAs for operation at short wavelengths in the 0.7-0.9 $\mu$m range approximately, and InP-InGaAsP or InP-AlGaInAs for operation at wavelengths longer than about 1 $\mu$m (e.g., 1.1-1.6 $\mu$m).

Voltage source 20 forward biases the cladding layers and thereby injects carriers into the active layer. These carriers recombine to generate spontaneous radiation in the case of an LED and predominantly stimulated radiation in the case of a laser. In either case, however, the radiation has a wavelength corresponding to the bandgap of the active layer material. Moreover, in the case of a laser or edge-emitting LED, as shown in FIG. 1, the radiation 22 is emitted in the form of a beam along axis 23. In the laser the beam is collimated, and axis 23 extends perpendicular to a pair of resonator mirrors 24 and 26 formed illustratively by cleaved crystal facets or etched surfaces. These mirrors constitute optical feedback means for the stimulated radiation. In other applications, for example integrated optics, diffraction gratings may be employed as a substitute for one or both of the mirrors.

Although the electrode means depicted in the laser or edge-emitting LED of FIG. 1 includes broad area contacts 16 and 18, it is well known in the art that these contacts can be patterned to form various geometrical shapes. Thus, in the case of transversely-emitting LED, in which the light output is taken perpendicular to the layers, contact 16 is typically a broad area contact, but contact 18 might be an annular ring (not shown) which accommodates an etched hole (not shown) in one side of body 11. Where the bottom portions (e.g., substrate) of body 11 is absorbing, this etched hole is used to couple radiation to an optical fiber (not shown) positioned in the hole.

The conductivity type of the active layer is not critical. It may be n-type, p-type, intrinsic or compensated since in typical modes of operation under forward bias the number of injected carriers may exceed the doping level of the active layer. In addition, the intermediate region 14 may include a multiple of layers which constitute an active region, e.g. contiguous p-type and n-type layers of the same bandgap forming a p-n homojunction or of different bandgaps forming a p-n heterojunction. Furthermore, the heterostructure may take on configurations other than the simple double heterostructure including, by way of example but without limitation, separate confinement heterostructures as described by I. Hayashi in U.S. Pat. No. 3,691,476, strip buried heterostructures of the type described by R. A. Logan and W. T. Tsang in U.S. Pat. No. 4,190,813, and isotype heterostructures of the type described by R. L. Hartman et al in U.S. Pat. No. 4,313,125.

For CW laser operation at room temperature, the thickness of the active layer is preferably between approximately $\lambda/2$ and 1.0 $\mu$m, where $\lambda$ is the wavelength of the radiation as measured in the semiconductor. For operation at low thresholds, the thickness is typically 0.12 to 0.20 $\mu$m. However, for LED operation a thicker active layer, typically 2 to 3 $\mu$m, is suitable. In either case, for room temperature operation the laser or LED is typically bonded to a suitable heat sink, not shown.

In practice, the layers of a double heterostructure are typically grown by an epitaxial process such as liquid phase epitaxy (LPE), molecular beam epitaxy (MBE), or metallo-organic chemical vapor deposition (MOCVD). Epitaxial growth takes place on a single crystal substrate 28 which may include a buffer layer (not shown) between the substrate 28 and the first cladding layer 10. Also, as shown in FIGS. 1 and 3 a contact-facilitating layer 30 is optionally included between the second cladding layer 12 and the top contact 16. The opposite contact 18 is formed on the bottom of substrate 28.

As mentioned previously, in order to constrain the pumping current generated by source 20 to flow in a relatively narrow channel 36 through the active region, constraining means 32 is provided within body 11; i.e., high resistivity zones 32 are formed in the semiconductor layers, illustratively in layers 10, 12, 14, and 30, by means well known in the art. Techniques for forming zones 32 include, for example, proton bombardment, oxygen bombardment, or suitable etching and regrowth of high resistivity material. Illustratively, the zones 32 have a resistivity on the order of $10^5$–$10^6$ $\Omega$-cm, whereas channel 36 has a resistivity of only 0.1 $\Omega$-cm so that typical ratios of resistivity are in the range of $10^6$:1 to $10^7$:1.

Trapezoidal Channel Structures

In accordance with an illustrative embodiment of our invention shown in FIG. 1, current constraining means 32 forms a relatively high conductivity current flow channel 36 which is narrower (width $S_1$) at its top near major surface 44 and wider (width $S_2$) at its bottom near the active region (i.e., layer 14). Constraining means 32 comprises laterally separate high resistivity regions 32.1 and 32.2 which bound the channel 36 along its oblique sides 36.1. Although these sides are depicted as straight lines, in practice a linear relationship is not necessary and indeed may not result from actual processing techniques.

We have found that the above shape of the current channel has important effects on device performance. The narrower channel width at the top increases the current density and thereby the power at which kinks occur. The depth of the high resistivity regions, which preferably extend through the active region 14, affects device capacitance and the amount of spontaneous emission generated in lasers. These matters will be discussed in greater detail later.

Alternatively, as shown in FIG. 2, the channel 36 formed by high resistivity regions 32.1 and 32.2 need not reach major surface 44. However, in order that the device resistance be not too high, a dopant may be diffused or otherwise introduced into the surface 44 so as to create a highly conducting diffusion front 45 which penetrates channel 36. In this case, the width $S_1$ at the top of the channel 36 is defined by the intersection of the front 45 and the oblique sides 36.1.

The realization of constraining means 32 in accordance with our invention need not be limited to configurations in which the channel has a trapezoidal shape. In the Hi-Lo structures discussed in the next section, constraining means 32 may form a coupled pair of stacked channels.

Moreover, although the trapezoidal channel 36 depicted in FIG. 1 constitutes essentially a parallelipiped extending parallel to axis 23, in the case of transversely-emitting LED channel 36 might have the shape of a truncated cone having its axis perpendicular to the layers.

Hi-Lo Structures

In accordance with this embodiment of our invention shown in FIG. 3, current constraining means 32 has a bi-level or stepped configuration forming a pair of coupled channels 36a and 36b. In particular, means 32 includes first means 32.1a–32.2a defining a relatively narrow upper channel 36a and second means 32.1b–32.2b defining a relatively wider lower channel 36b. Illustratively, the constraining means 32 comprises high resistivity regions 32.1–32.2 which bound relatively high conductivity channels 36a and 36b. The regions 32 include upper zones 32.1a and 32.2a and lower zones 32.1b and 32.2b. The upper zones are separated by a relatively narrow distance $S_1$ and extend from the upper major surface 44 of body 11 to a depth $d_1$ short of the active region, thereby defining the narrow upper channel 36a. In contrast, the lower zones are separated by a relatively wider distance $S_2 > S_1$ and extend from the depth $d_1$ into or through the active region (e.g., to a depth $d_2$), thereby defining the wider lower channel 36b.

As before, channels 36a and 36b may have the approximate shape of parallelipipeds extending perpendicular to the plane of the paper, as in a laser or edge-emitting LED; or in a transversely-emitting LED may form cylinders extending transverse to the layers.

When the high-resistivity regions 32 were fabricated by proton bombardment in GaAs-AlGaAs lasers, this Hi-Lo structure exhibited several advantages. First, the narrow upper channel 36a increased the current density in the active region and thereby caused kinks to be shifted to satisfactorily high current levels out of the range of typical laser operation compared to wide (e.g., 12 $\mu$m) stripe geometry DH lasers. Second, this feature also resulted in more uniformly distributed and lower lasing threshold lasers, providing higher yields. Third, because the wider lower channel 36b reduced lateral current diffusion and spreading, less spontaneous radiation was emitted outside the resonator of the laser, thereby allowing for lower minimum modulation currents for predetermined extinction ratios in digital applications. Fourth, the latter feature resulted in reduced device capacitance for both lasers and LEDs, thereby permitting high speed of operation (i.e., higher pulse repetition rates in digital applications).

To reduce device capacitance the proton bombardment should penetrate the p-n junction which, in a conventional DH, is located at one of the interfaces between active layer 14 and cladding layers 10 and 12. However, to reduce spontaneous emission, the protons preferably penetrate through the active region where recombination occurs.

Fabrication of Trapezoidal Channels

As shown in FIG. 4, one way to fabricate a trapezoidal channel of the type shown in FIG. 1 is to epitaxially grow a removable semiconductor layer on major surface 44 and by well-known photolithography and preferential etching techniques to pattern the layer to form inverted trapezoidal openings 54 which expose portions of surface 44. Between the openings, the remaining segments 52 of the removable layer form trapezoidal attenuation masks. For a Group III-V compound semiconductor layer, the oblique side walls 56 of the remaining segments correspond to (111A) crystallographic planes which make an angle of about 55 degrees with a (100)-oriented surface 44.

Alternatively, the openings in the removable layer may be etched as inverted trapezoids so that the remaining segments 52 are trapezoids. In either case, therefore, the trapezoids and inverted trapezoids are complementary.

Bombardment of the masked surface 44 with particles 50 (e.g., protons, oxygen) results in deepest particle penetration between the segments, no penetration under the central (thickest) parts of the segments, and gradually decreasing penetration under the oblique sides of the segments. Of course, a thinner mask segment would allow some particle penetration under the central parts of the segments, a technique which would be useful in realizing the channel configuration of FIG. 2.

After bombardment is completed and before metallization to form electrical contacts, the attenuation masks are removed. To this end, it is preferable that the material of mask 52 be different from that portion of body 11 adjacent surface 44 so that stop-etch procedures can be advantageously employed. For example, surface 44 is typically GaAs in which case mask 52 could be AlGaAs and a well-known HF etchant or iodine etchant (e.g., 113 g KI, 65 g $I_2$, 100 cc $H_2O$) could be used as a stop-etch to remove mask 52. Plasma stop-etching may also be utilized as a substitute for wet-chemical procedures. Finally, it should be noted that a buffered peroxide solution is also a preferential etchant and can be used to etch the openings which form mask segments 52.

Formation of the removable layer also gives a fringe benefit related to the cleanliness of the epitaxial growth process. When liquid phase epitaxy is used to fabricate the semiconductor layers of these devices, the last grown layer typically gets contaminated from various sources, especially globules of the molten metal (e.g., Ga) used as the source solutions. Consequently, this last layer, which is usually the cap or contact-facilitating layer 30 (FIGS. 1-3), has to be cleaned by etching, a step which requires careful control since layer 30 is typically very thin (e.g., 0.5 $\mu$m). In the process described, here, however, the last-grown layer is the attenuation mask which can be much thicker (e.g., 3.0 $\mu$m) and can be readily removed by stop-etch techniques as mentioned above.

Fabrication of Hi-Lo Structures

A number of fabrication techniques can be employed to fabricate our Hi-Lo structure. As mentioned previously, the high resistivity regions 32 can be formed by proton bombardment, oxygen bombardment, or etching and regrowth of high resistivity material. For purposes of explanation, however, assume that these regions are formed by proton bombardment.

One straightforward technique would entail two proton bombardment steps and two masks. In the first step a proton attenuation mask $S_1$ wide and protons of energy $E_1$ (e.g., 150 keV) would be used to delineate narrow upper channel 36a. In the second step a proton attenuation mask $S_2$ wide and protons of energy $E_2 > E_1$ (e.g., $E_2 = 300$ keV) would be used to delineate wider lower channel 36b.

Delineation of the channels 36a and 36b in a single proton bombardment step is also possible. To do so a compound attenuation mask having higher proton attenuation in the center and lower attenuation on the sides can be used. Two versions of this type of mask are depicted in FIGS. 5 and 6. In each case a thick metal pad 40 of width $S_1$ is formed on top of a plateau 42 which in turn is formed on the major surface 44 nearest active region 14. Pad 40 essentially totally attenuates the protons 50 so that no proton damage occurs in the narrow channel 36a, and plateau 42 only partially attenuates the protons 50 so that damaged zones 32.1a and 32.2a extend to a depth $d_1$ short of the active region. Outside the plateau 42, the mask provides virtually no attenuation either in FIG. 5 (because the mask does not extend that far) or in FIG. 6 (because the mask is very thin there). Thus, outside the plateau 42 proton damaged zones 32.1b and 32.2b extend to a depth $d_2$ and penetrate the active region 14. Preferably, as shown, these damaged zones 32.1b and 32.2b extend through the active region 14. Illustratively, in FIGS. 5 and 6 pad 40 comprises plated Au. Plateau 42 in FIG. 5 comprises layers of Au (42.1), Pd or Pt (42.2), and Ti (42.3) and in FIG. 6 comprises a mesa of $SiO_2$ (42.4) overlayed with Ti-Pt layers (42.5).

The following examples describe in more detail how masks of this type were used to fabricate light emitting devices. Unless otherwise stated, numerical parameters and various materials are given for purposes of illustration only and are not intended to limit the scope of the invention. In each of the two examples, the semiconductor body 11 comprised a (100)-oriented, n-GaAs substrate 28 on which were grown by standard LPE the following epitaxial layers: an n-GaAs buffer layer (not shown); a n-$Al_{0.36}Ga_{0.64}As$ cladding layer 10 about 1.5 $\mu$m thick; a p-$Al_{0.08}Ga_{0.92}As$ active layer 14 about 0.15 $\mu$m thick; a p-$Al_{0.36}Ga_{0.64}As$ cladding layer 12 about 1.5 $\mu$m thick; and a highly doped p-GaAs cap layer 30 about 0.5 $\mu$m thick. The completed wafer (body 11 plus epitaxial layers) was processed as follows to fabricate light emitting devices, particularly lasers.

EXAMPLE I

To fabricate lasers using the compound attenuation mask 40-42 of FIG. 5, a lift-off photoresist mask was deposited on surface 44, and standard photolithographic techniques were used to open an elongated stripe window 12 $\mu$m or 18 $\mu$m wide perpendicular to the {110} cleavage planes. Ti, Pd, and Au layers 42.3, 42.2, and 42.1 were sequentially deposited using a vacuum E-gun system. The deposition rate was controlled by a commercially available monitoring system so that the Ti, Pd, and Au layers had thicknesses of 1000 Angstroms, 1500 Angstroms, and 5000 Angstroms, respectively. The total thickness of 0.75 $\mu$m for plateau 42 was selected to provide 50 percent reduction in the penetration depth of 300 keV protons 50. The stripe geometry plateau 42 was then formed by well-known etching procedures to lift-off the photoresist mask.

Next, the pad 40 was formed also in the shape of a 5 μm wide stripe by electroplating Au to a thickness of about 1-2 μm using standard photolithographic procedures. The Au pad 40 provided essentially a complete barrier to the high energy (300 keV; dosage $3\times10^{15}$ cm$^{-2}$) protons 50, thus forming narrow upper channel 36a of width $S_1=5$ μm and wider lower channel 36b of width $S_2=12$ μm or 18 μm. Between $S_1$ and $S_2$ the plateau 42 provided only partial attenuation so that protons penetrated to a depth $d_1=1.5$ μm. Outside $S_2$ no attenuation mask was present, and protons penetrated to a depth $d_2=2.8$ μm and hence extended through the active layer 14.

EXAMPLE II

To simplify the fabrication procedure of Example I, the Ti-Pd-Au plateau 42 was replaced as shown in FIG. 6 with dielectric stripe 42.4 (e.g., SiO$_2$ or Si$_3$N$_4$) overlayed with Ti-Pt layer 42.5. This compound mask was made by depositing about 1.0-1.2 μm of SiO$_2$ on surface 44 using standard vapor phase techniques. This thickness was again chosen to provide 50 percent attenuation to the 300 keV protons 50. Next, the SiO$_2$ layer was photolithographically delineated and etched in standard buffered HF etchant to form stripes 12 μm or 18 μm wide perpendicular to the {110} cleavage planes. After removing the photolithography mask, the SiO$_2$ stripe 42.4 and the surface 44 were covered with 1000 Angstroms of Ti and then 1500 Angstroms of Pt by standard evaporation procedures. Finally, pad 40 was formed in the shape of a 5 μm stripe 1-2 μm thick using standard photolithography and electroplating techniques. As before, the masked wafers were subjected to 300 keV protons in a dosage of $3\times10^{15}$ cm$^{-2}$ to form simultaneously the narrow upper channel 36a and the wider lower channel 36b. In this case layer 42.5 reduced the proton energy so that $d_2$ decreased to about 2.3 μm.

In both Examples I and II, after proton bombardment was completed, the compound masks 40-42 were removed from surface 44 by means of an HF etchant. This step also prepared the surface 44 for subsequent metallization to form standard p-metal contacts.

EXPERIMENTAL RESULTS—HI-LO STRUCTURES

In order to provide a standard for comparison, one half of each wafer in Examples I and II was processed into control lasers having 5 μm wide stripes with shallow proton bombardment (150 keV). Each remaining half wafer was processed as above into Hi-Lo lasers using compound masks 40-42 of three types: Type (1)—5 μm wide Au pad 40 on 18 μm wide SiO$_2$/Ti-Pt plateau 42 (Example II); Type (2)—5 μm wide Au pad 40 on 12 μm wide SiO$_2$/Ti-Pt plateau 42 (Example II); and Type (3)—5 μm wide Au pad 40 on 18 μm wide Ti-Pd-Au plateau 40 (Example I).

Comparisons set forth in the table below were based on a number of parameters: spontaneous emission power $S_L$ at 50 mA of drive current; slope $\Delta S_L$ of spontaneous emission portion of the L-I curve; capacitance C measured at 1 MHz (average C is listed below); and minimum modulation current MMI which is defined as the difference in current between upper and lower light power levels $P_2$ and $P_1$, respectively, which yield a light intensity extinction ratio $E_R$ between ON and OFF states when the laser is pulsed (the median MMI is listed below for $E_R=15:1$, $P_2=2.5$ mW, and $P_1=0.167$ mW).

| Parameter | LASER TYPE | | | | | |
| --- | --- | --- | --- | --- | --- | --- |
| | Control | Type (1) | Control | Type (2) | Control | Type (3) |
| $S_L$ (mW) | 0.200 | 0.151 | 0.142 | 0.042 | 0.071 | 0.041 |
| $\Delta S_L$ (mW) | 0.29 | 0.28 | 0.20 | 0.07 | 0.12 | 0.06 |
| MMI (mA) | 59 | 45 | 76.5 | 24 | 70.5 | 26 |
| C (pf) | 83 | 21 | 115 | 35 | 54 | 12 |

In addition to the data shown in the table, we found that 90 percent of the Type (2) lasers had MMIs within a specified 30 mA MMI with a statistical variance $2\sigma \simeq 3$ mA. Similarly, 75 percent of the Type (3) lasers had MMI within 30 mA whereas none of the corresponding control lasers did. These results imply improved device yield.

Note that the Type (2) lasers, which have $S_2=12$ μm wide stripes, exhibit the largest decrease in $S_L$ and the highest yield for an MMI$\leq$30 mA, but these advantages alone do not necessarily dictate the use of this stripe width. Consideration should be given to the impact on the light power output level $P_k$ at which kinks occur. In general, we found that kink formation occurred at higher $P_k$ in the control lasers than in Hi-Lo lasers, but the latter were still well within specifications (i.e., $P_k \geq 3$ mW). Type (1) lasers showed little change in $P_k$. However, the Type (2) lasers, which utilized the narrowest attenuation masks ($S_2=12$ μm), showed a marked reduction of about 50 percent in $P_k$ compared to corresponding control lasers. In contrast, Type (3) lasers, which had $S_2=18$ μm, had a smaller reduction of about 35 percent in $P_k$. This data suggests that it may be advantageous for the width $S_2$ to be between 12 μm and 18 μm.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, as described in the concurrently filed application of R. L. Hartman et al, supra, the first means defining the narrow upper channel 36a can be realized by means of a groove etched into the upper surface 44. Consequently, a groove in combination with a wider lower chanel 36b is expected to have features and advantages comparable to those described above.

What is claimed is:

1. In a semiconductor light emitting device, a semiconductor body comprising
   an active region in which optical radiation is generated when current flows therethrough, and
   means within said body for constraining said current to flow from a surface of said body in a channel through said active region, said channel being narrow near said surface and wider near said active region.

2. The body of claim 1 wherein
   said constraining means comprises
      first means for causing said current to flow in relatively narrow upper channel which extends from said surface to a depth short of said active region, and
      second means for causing said current flow in relatively wider lower channel which extends from said depth to said active region.

3. The body of claim 2 wherein said second means comprises a pair of high resistivity second zones bounding said lower channel.

4. The body of claim 3 wherein said second zones extend through said active region.

5. The body of claim 3 wherein said first means comprises a pair of high resistivity first zones bounding said upper channel.

6. The body of claims 3, 4, or 5 wherein said high resistivity zones comprises proton bombarded zones.

7. The body of claims 3, 4, or 5 wherein said upper channel is about 5 μm wide and said lower channel is between about 12 and 18 μm wide.

8. The body of claims 3, 4, or 5 comprising
a first cladding layer,
a second cladding layer nearer said surface than said first layer,
said active region comprising an active layer between said cladding layers, and wherein
said upper channel extends from said surface to said depth located in said second cladding layer, and
said lower channel extends from said depth through said active layer.

9. The body of claim 8 for use in a laser having a resonator axis along which radiation propagates and wherein said constraining means defines said channels as elongated parallelipipeds extending essentially parallel to said axis.

10. The body of claim 8 for use in a light emitting diode and wherein said constraining means defines said channels as cylinders extending transverse to said layers.

11. A double heterostructure semiconductor laser comprising
a semiconductor body having a major surface and including first and second cladding layers and an active layer therebetween,
electrode means for applying pumping current to flow from said surface through said active layer, thereby resulting in the emission of stimulated radiation from said active layer,
optical feedback means for resonating said radiation along an axis parallel to said layers, and
means within said body for constraining said pumping current to flow in a channel from said major surface through said active layer, said constraining means comprising
first means within said body for causing said current to flow in a relatively narrow upper channel which extends from said major surface to a depth short of said active layer, and
second means within said body for causing said current to flow in a relatively wider lower channel which extends from said depth through said active layer.

12. The laser of claim 11 wherein
said first means comprises a pair of laterally separate, high resistivity, proton bombarded first zones bounding said upper channel, and
said second means comprises a pair of laterally separate, high resistivity, proton bombarded second zones bounding said lower channel.

13. The laser of claim 12 wherein said first channel is about 5 μm wide and said second channel is between about 12 and 18 μm wide.

* * * * *

UNITED STATES PATENT AND TRADEMARK OFFICE
CERTIFICATE OF CORRECTION

PATENT NO. : 4,447,905

DATED : May 8, 1984

INVENTOR(S) : Richard W. Dixon, William B. Joyce, Louis A. Koszi, Richard C. Miller and Bertram Schwartz It is certified that error appears in the above-identified patent and that said Letters Patent is hereby corrected as shown below:

Page 1, item [75], add --William B. Joyce--.

Signed and Sealed this

Sixth Day of November 1984

[SEAL]

Attest:

GERALD J. MOSSINGHOFF

*Attesting Officer*    *Commissioner of Patents and Trademarks*